US012787524B2

(12) United States Patent
Liu et al.

(10) Patent No.: US 12,787,524 B2
(45) Date of Patent: Nov. 3, 2026

(54) DISPLAY DEVICE AND MANUFACTURING METHOD THEREOF

(71) Applicant: AUO Corporation, Hsin-Chu (TW)

(72) Inventors: Shu-Jiang Liu, Hsin-Chu (TW); Rong-Sheng Tsai, Hsin-Chu (TW); Jia-Hao Hsu, Hsin-Chu (TW); Kun-Cheng Tien, Hsin-Chu (TW)

(73) Assignee: AUO CORPORATION, Hsin-Chu (TW)

(*) Notice: Subject to any disclaimer, the term of this patent is extended or adjusted under 35 U.S.C. 154(b) by 356 days.

(21) Appl. No.: 18/530,443

(22) Filed: Dec. 6, 2023

(65) Prior Publication Data

US 2024/0405175 A1 Dec. 5, 2024

(30) Foreign Application Priority Data

May 31, 2023 (TW) ................................ 112120285

(51) Int. Cl.
*H10H 20/857* (2025.01)
*H10H 20/01* (2025.01)
(Continued)

(52) U.S. Cl.
CPC ........ *H10H 20/857* (2025.01); *H10H 20/853* (2025.01); *H10H 20/856* (2025.01);
(Continued)

(58) Field of Classification Search
CPC .. H10H 20/857; H10H 20/853; H10H 20/856; H10H 20/0362; H10H 20/0363;
(Continued)

(56) References Cited

U.S. PATENT DOCUMENTS

| | | | | |
|---|---|---|---|---|
| 9,337,386 | B2 | 5/2016 | Zhang | |
| 2020/0013759 | A1* | 1/2020 | Yoo | H01L 25/0753 |

(Continued)

FOREIGN PATENT DOCUMENTS

| | | | |
|---|---|---|---|
| CN | 113471241 | A | 10/2021 |
| CN | 116314164 | A | 6/2023 |
| TW | I729766 | B | 6/2021 |

OTHER PUBLICATIONS

Office Action issue by (TIPO) Taiwan Intellectual Property Office Ministry of Economic Affairs R.O.C. on Feb. 6, 2024 for Application No. 112120285, Tawian.

*Primary Examiner* — Jeff W Natalini
*Assistant Examiner* — Nicholas Leland Hutson
(74) *Attorney, Agent, or Firm* — Tim Tingkang Xia, Esq.; Troutman Pepper Locke LLP

(57) ABSTRACT

A display device includes a circuit substrate and at least one light emitting diode (LED) packaging structure electrically connected to the circuit substrate. Each of the at least one LED packaging structure includes a plurality of LEDs, a plurality of transparent packaging structures, a molding layer, a redistribution structure and a common electrode. Each LED includes a first electrode, a semiconductor stack structure and a second electrode stacked with each other. The transparent packaging structures respectively surround the LEDs. The molding layer surrounds the transparent packaging structures. The redistribution structure is located on a first side of the molding layer and is electrically connected to the first electrodes of the LEDs. The common electrode is located on a second side of the molding layer and is electrically connected to the second electrodes of the LEDs.

5 Claims, 23 Drawing Sheets

(51) Int. Cl.

| | |
|---|---|
| ***H10H 20/853*** | (2025.01) |
| ***H10H 20/856*** | (2025.01) |
| ***H10W 90/00*** | (2026.01) |

(52) U.S. Cl.

CPC ........ *H10W 90/00* (2026.01); *H10H 20/0362* (2025.01); *H10H 20/0363* (2025.01); *H10H 20/0364* (2025.01)

(58) Field of Classification Search

CPC ............. H10H 20/0364; H10H 29/142; H10H 20/036; H10W 90/00; G09F 9/33

See application file for complete search history.

(56) References Cited

U.S. PATENT DOCUMENTS

| | | | | |
|---|---|---|---|---|
| 2020/0168777 | A1* | 5/2020 | Kang | H01L 25/0753 |
| 2020/0343230 | A1* | 10/2020 | Sizov | H01L 25/0753 |
| 2021/0191174 | A1 | 6/2021 | Li | |
| 2024/0136489 | A1* | 4/2024 | Jeon | H10H 20/857 |

* cited by examiner

DISPLAY DEVICE AND MANUFACTURING METHOD THEREOF

CROSS-REFERENCE TO RELATED PATENT APPLICATION

This non-provisional application claims priority to and the benefit of, pursuant to 35 U.S.C. § 119 (a), patent application No. 112120285 filed in Taiwan on May 31, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a display device and a manufacturing method thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The micro light emitting diode (micro LED) display is a new generation display technology, and the core technology thereof exists in how to accurately transfer a large number of micro LEDs to a pixel array substrate. However, the transfer technology involves mechanical operations, and the effectiveness of the transfer depends on the precision of the machine and the accuracy and yield of the transfer printing device itself. When extracting micro LEDs, issues such as machine movement errors and accuracy errors of the transfer printing device may arise. Further, when placing the micro LEDs, issues such as machine movement alignment errors may also arise. If the micro LEDs are not correctly placed on the intended locations, they may not operate normally. Therefore, there is an urgent need for a method to address the aforementioned issues.

SUMMARY

At least one embodiment of the present disclosure provides a manufacturing method of a display device, which includes the following steps: providing a plurality of light emitting diodes on a first transpose carrier plate, wherein each of the light emitting diodes comprises a first electrode, a semiconductor stack structure and a second electrode stacked with each other; forming a plurality of transparent packaging structures respectively on the light emitting diodes; forming a molding layer on the first transpose carrier plate, wherein the molding layer is located between adjacent ones of the transparent packaging structures; forming a redistribution structure at a first side of the molding layer, wherein the redistribution structure is electrically connected to the first electrodes of the light emitting diodes; connecting a second transpose carrier plate to the redistribution structure, and removing the first transpose carrier plate; forming a common electrode at a second side of the molding layer, wherein the common electrode is electrically connected to the second electrodes of the light emitting diodes; and electrically connecting the redistribution structure to a circuit substrate.

At least one embodiment of the present disclosure provides a display device includes a circuit substrate and at least one light emitting diode (LED) packaging structure electrically connected to the circuit substrate. Each of the at least one LED packaging structure includes a plurality of LEDs, a plurality of transparent packaging structures, a molding layer, a redistribution structure and a common electrode. Each LED includes a first electrode, a semiconductor stack structure and a second electrode stacked with each other. The transparent packaging structures respectively surround the LEDs. The molding layer surrounds the transparent packaging structures. The redistribution structure is located on a first side of the molding layer and is electrically connected to the first electrodes of the LEDs. The common electrode is located on a second side of the molding layer and is electrically connected to the second electrodes of the LEDs.

These and other aspects of the present disclosure will become apparent from the following description of the embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1A:
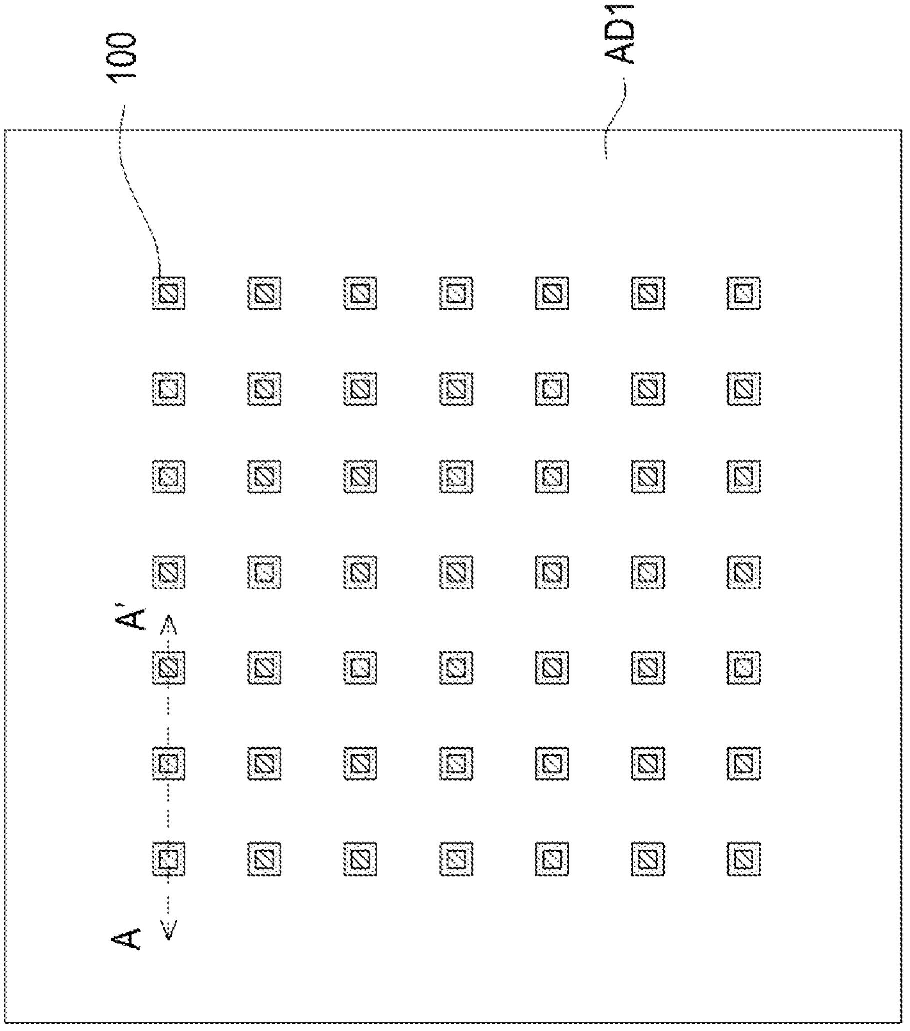
FIG. 1A to FIG. 1H are top schematic views of a manufacturing method of a display device according to certain embodiments of the present disclosure.

FIG. 1A to FIG. 1H are top schematic views of a manufacturing method of a display device according to certain embodiments of the present disclosure. FIG. 2A to FIG. 2H are sectional schematic views of FIG. 1A to FIG. 1H along the line A-A'. Referring to FIG. 1A and FIG. 2A, a plurality of LEDs 100 are provided on a first transpose carrier plate TS1. In the present embodiment, a first adhering layer AD1 is formed on the first transpose carrier plate TS1, and the first transpose carrier plate TS1 adheres the LEDs 100 through the first adhering layer AD1.

In certain embodiments, the LEDs 100 are formed on a growth substrate (not illustrated), and then the LEDs 100 are transferred from the growth substrate to the first transpose carrier plate TS1 by a transfer process. In certain embodiments, the transfer process is a mass transfer process, which includes extracting the LEDs 100 by electrostatic absorption, vacuum absorption, van der Waals absorption or other methods, but the present disclosure is not limited thereto.

The LEDs 100 are vertical LEDs, and each LED 100 includes a first electrode 104, a semiconductor stack structure and a second electrode 102 stacked with each other. The semiconductor stack structure includes a first type semiconductor 130, a light emitting layer 120 and a second type semiconductor 110 stacked together. One of the first type semiconductor 130 and the second type semiconductor 110 is the N-type semiconductor, and the other thereof is the P-type semiconductor. The first electrode 104 is located on the first type semiconductor 130, and the second electrode 102 is located on the second type semiconductor 110. The first electrode 104 and the second electrode 102 are respectively located at different sides of each LED 100. In the present embodiment, the first electrode 104 of each LED 100 is away from the first adhering layer AD1, and the second electrode 102 is close to the first adhering layer AD1.

In certain embodiments, the LEDs 100 include red LEDs, green LEDs, blue LEDs, LEDs of other colors, or a combination of the aforementioned LEDs. In certain embodiments, the LEDs 100 of the same color are arranged in a same column, but the present disclosure is not limited thereto. The arrangement of the LEDs 100 may be adjusted based on the actual needs.

Figure 1B:
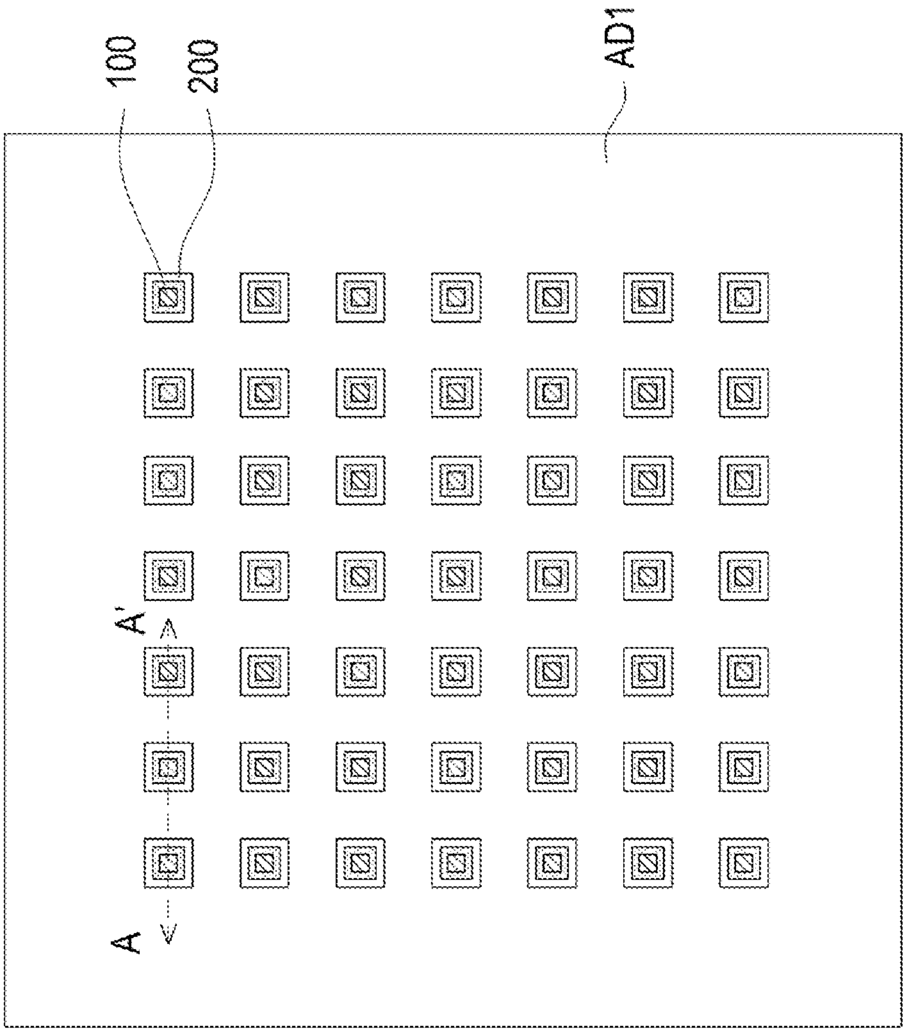
Figure 2A:
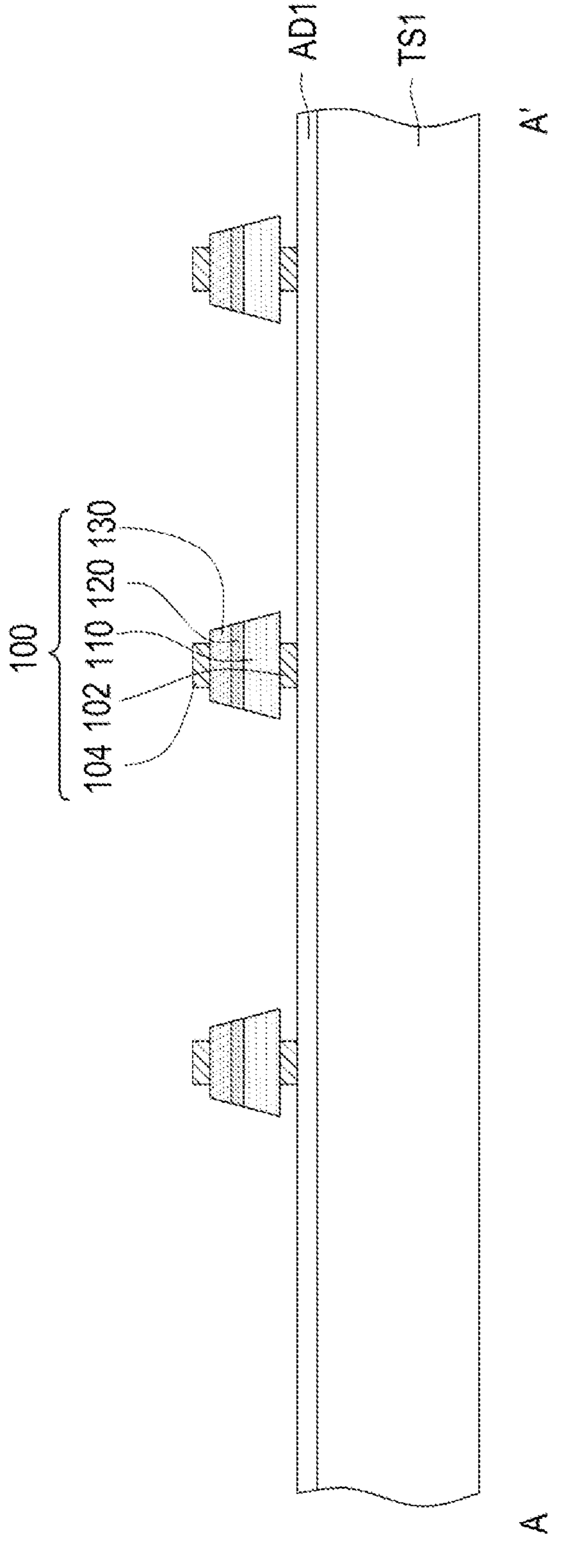
FIG. 2A to FIG. 2H are sectional schematic views of FIG. 1A to FIG. 1H along the line A-A'.
Figure 2B:
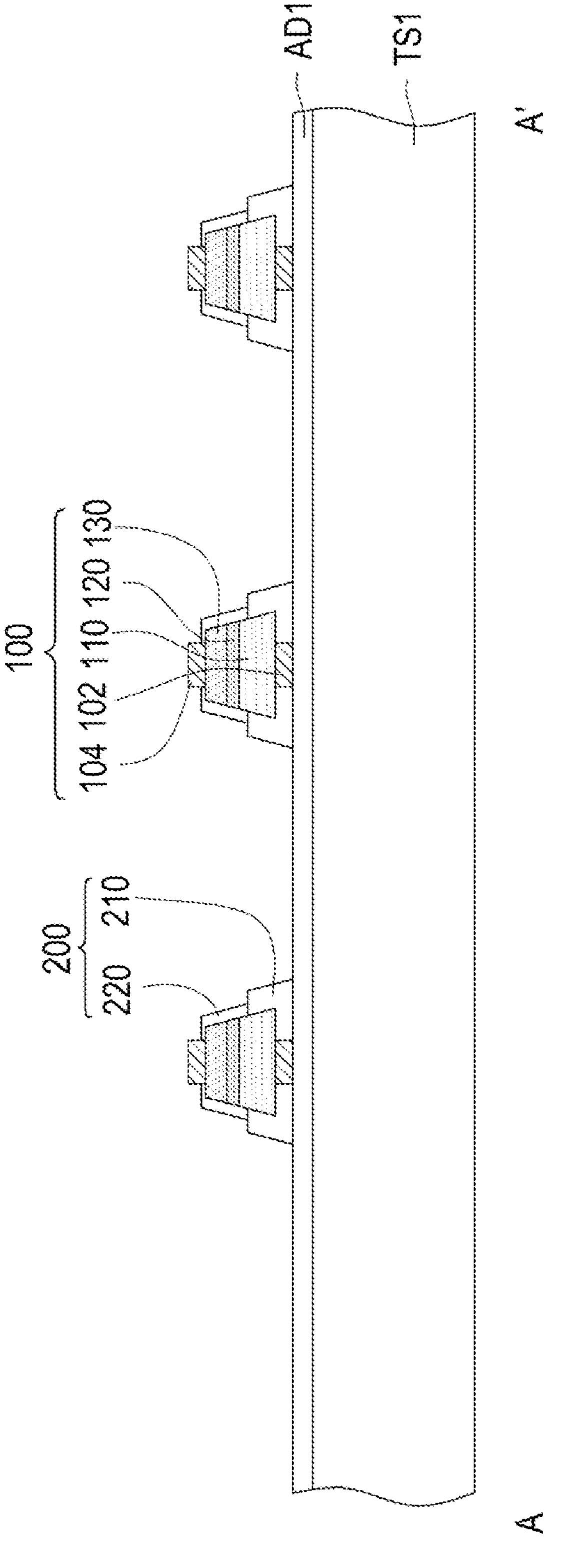

Referring to FIG. 1B and FIG. 2B, a plurality of transparent packaging structures 200 are respectively formed on the LEDs 100. Each transparent packaging structure 200 surrounds a corresponding LED 100, and the transparent packaging structures 200 are separated from each other. The transparent packaging structures 200 may protect the LEDs 100, and may further serve as the light guide structures of the LEDs 100.

In certain embodiments, the method of forming the transparent packaging structure 200 includes the following steps. Firstly, a plurality of first covering layers 210 are formed on the first transpose carrier plate TS1, where the first covering layers 210 respectively surround the LEDs 100. In certain embodiments, a material of the first covering layers 210 includes a photoresist, and the method of forming the first covering layers 210 includes a photolithography process. After forming the first covering layers 210, a plurality of second covering layers 220 are respectively formed on the first covering layers 210. In certain embodiments, a material of the second covering layers 220 includes a photoresist, and the method of forming the second covering layers 220 includes the photolithography process. Each transparent packaging structure 200 includes a corresponding one of the first covering layers 210 and a corresponding one of the second covering layers 220. In certain embodiments, a width of each first covering layer 210 is greater than a width of each second covering layer 220, such that a side wall of each transparent packaging structure 200 has a ladder structure. Although the present embodiment uses each transparent packaging structure 200 having a ladder structure as an example, the present disclosure is not limited thereto. In other embodiments, the transparent packaging structures 200 are formed by a single photolithography process, and the side wall of each transparent packaging structure 200 does not have the ladder structure.

In the present embodiment, the transparent packaging structures 200 are formed by multiple photolithography processes, which may enhance the thickness of the transparent packaging structures 200. The height of top surfaces of the transparent packaging structures 200 is preferably higher than the height of the light emitting layers 120 of the LEDs 100. In other words, the transparent packaging structures 200 preferably cover the side walls of the light emitting layers 120. The transparent packaging structures 200 optionally cover the surfaces of the LEDs 100 (such as the upper surface of the first type semiconductor 130 as shown in FIG. 2B) away from the first adhering layer AD1. However, the transparent packaging structures 200 expose the first electrodes 104.

Figure 1C:
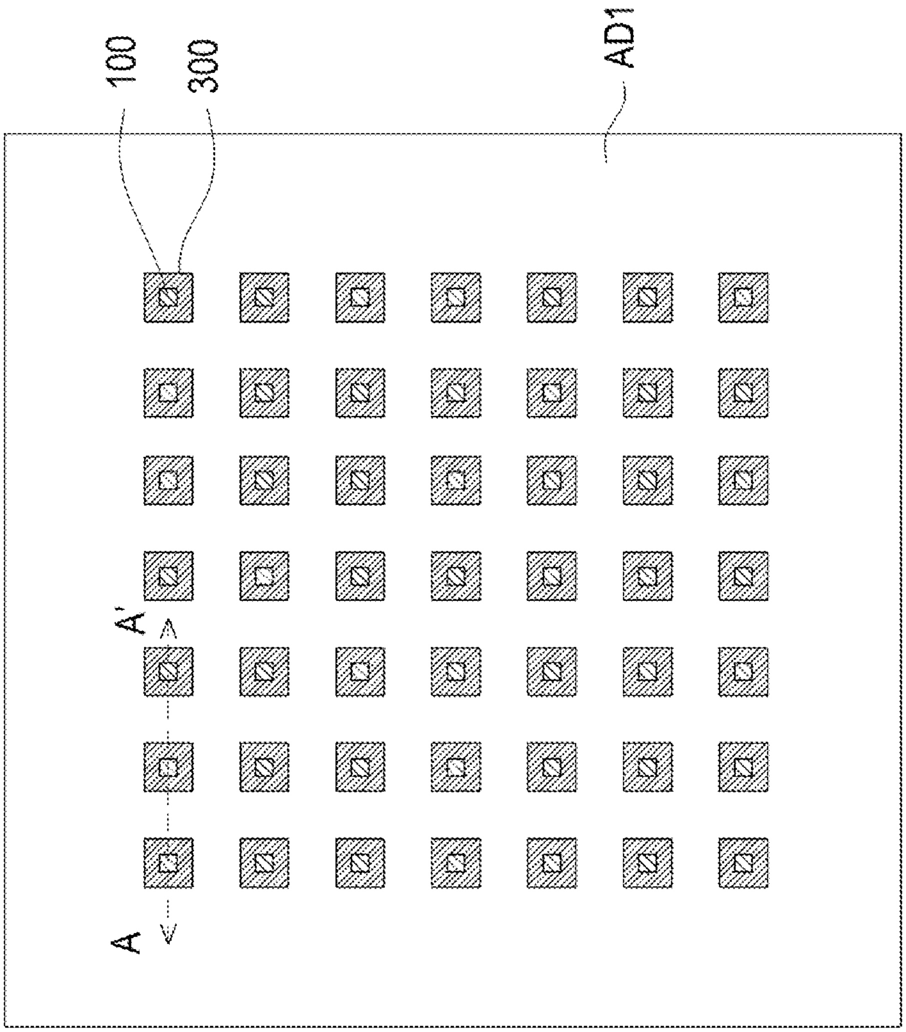
Figure 2C:
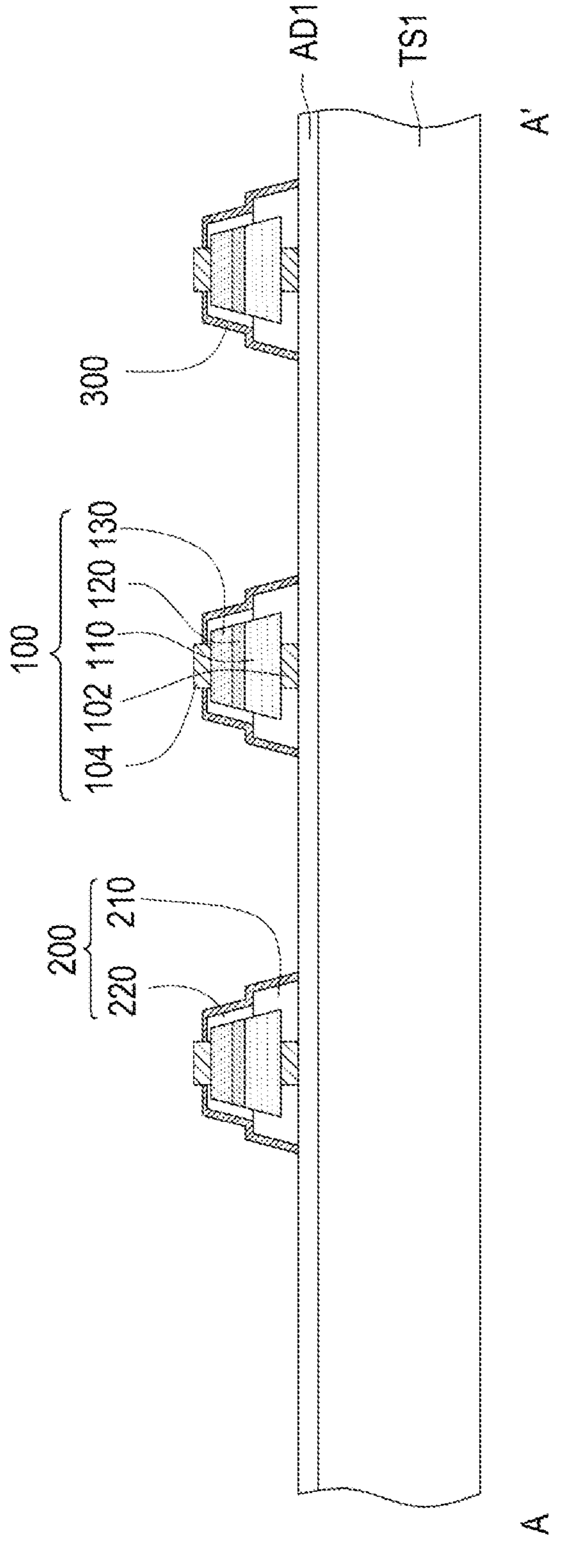

Referring to FIG. 1C and FIG. 2C, a plurality of reflective structures 300 are respectively formed on the transparent packaging structures 200. In certain embodiments, the reflective structures 300 include a polymer material (such as an epoxy resin based polymer material) with high reflectivity (such as the reflectivity being greater than 85% in the visible light wavelength range (350 nm to 800 nm)) or other suitable materials. In one embodiment, the epoxy resin-based polymer material may be used as the Epoxy Molding Compound (EMC). In certain embodiments, the reflective structures 300 include an insulating material.

The reflective structures 300 are conformal to the side walls of the transparent packaging structures 200. In the present embodiment, the side wall of each transparent packaging structure 200 has the ladder structure. Thus, the reflective structures 300 also have ladder structures. The reflective structures 300 expose the first electrodes 104 of the LEDs 100. In certain embodiments, there is no gap between the reflective structures 300 and the first electrodes 104, or the gap between the reflective structures 300 and the first electrodes 104 is less than the gap between the reflective structures 300 and the second electrodes 102, which may prevent the light emitted by the LEDs 100 from leaking between the reflective structures 300 and the first electrodes 104.

By providing the reflective structures 300, the light coupling efficiency of the LEDs 100 may be enhanced, and the crosstalk between the different LEDs 100 may be reduced.

Figure 1D:
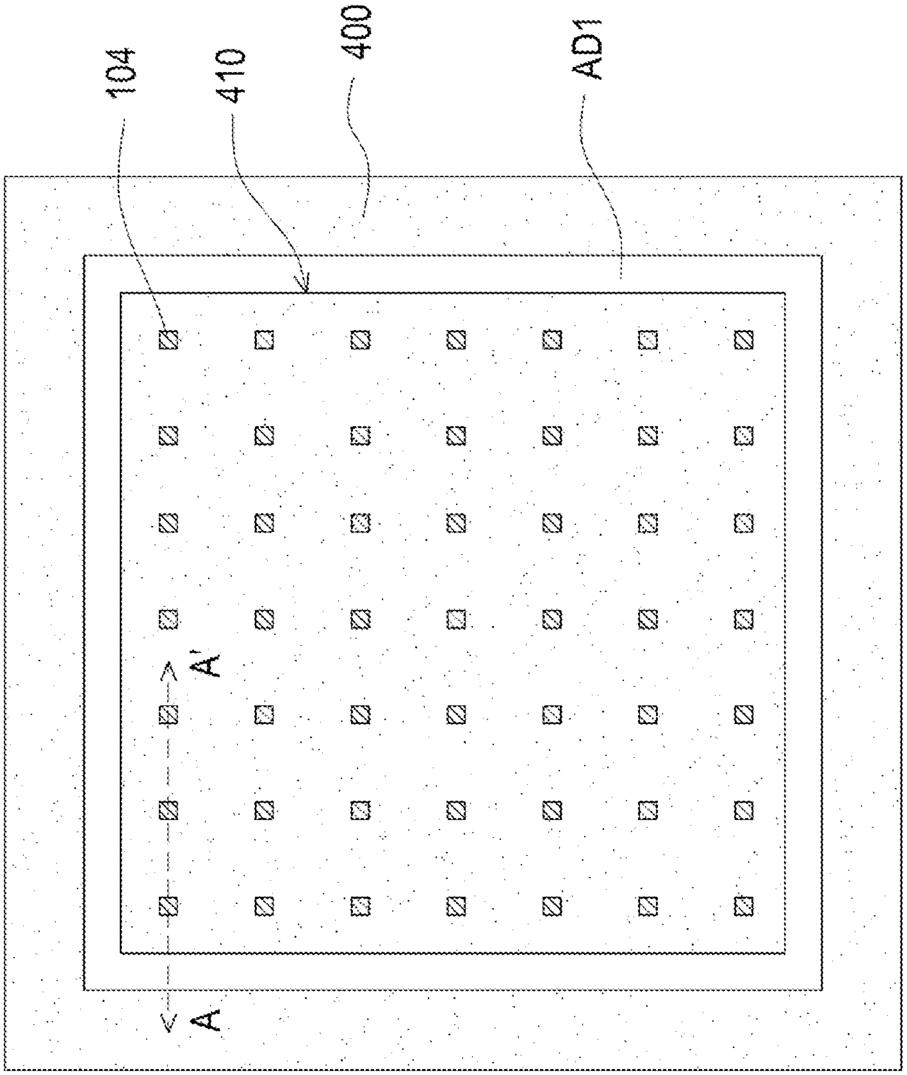
Figure 2D:
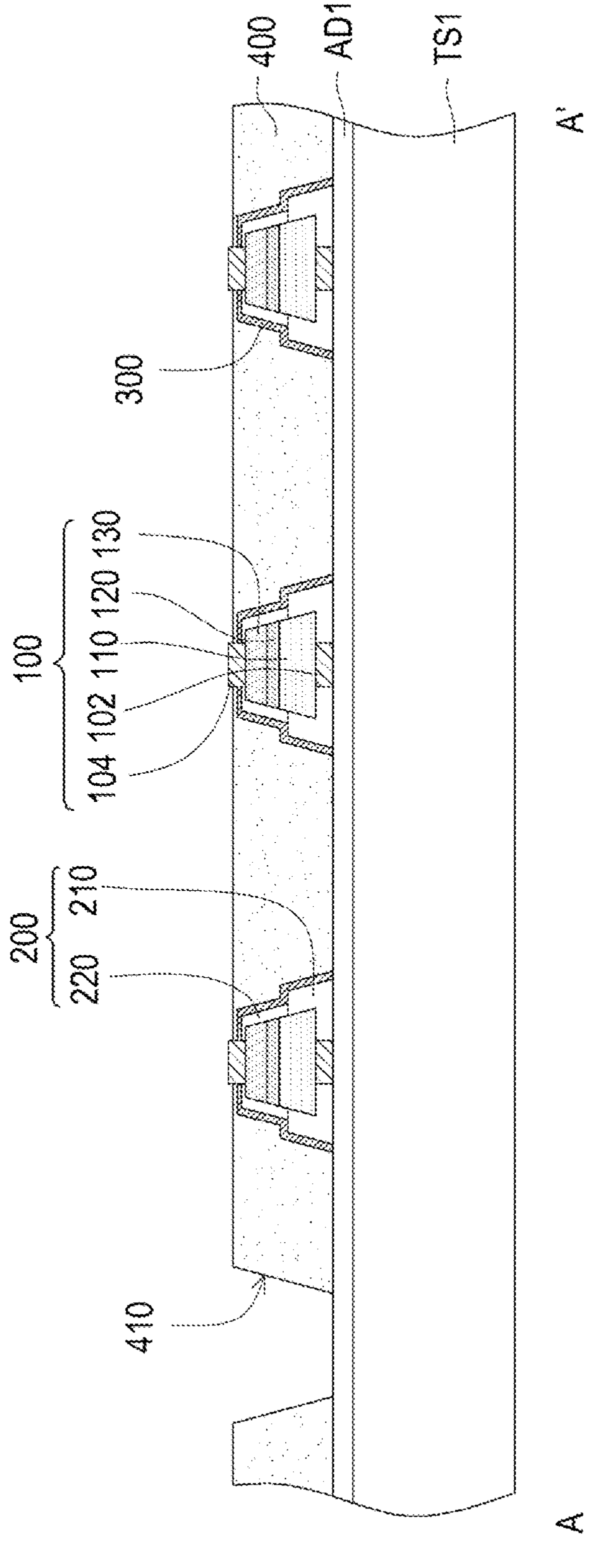

Referring to FIG. 1D and FIG. 2D, a molding layer 400 is formed on the first transpose carrier plate TS1, and the molding layer 400 is located between adjacent ones of the transparent packaging structures 200. The reflective structures 300 are located between the molding layer 400 and the transparent packaging structures 200. The molding layer 400 between the LEDs 100 is a continuous structure. In the present embodiment, the molding layer 400 surrounds and contacts the side walls of the first electrodes 104 of the LEDs 100, but the present disclosure is not limited thereto. In other embodiments, the molding layer 400 is separated from the first electrodes 104, and a top surface of the molding layer 400 is lower than top surfaces of the reflective structures 300. In FIG. 2D, the height of the top surfaces of the first electrodes 104 is higher than the height of the top surface of the molding layer 400, and the molding layer 400 exposes the first electrodes 104.

In certain embodiments, the method of forming the molding layer 400 includes molding. Specifically, a liquid or semi-solid organic material is applied on the first transpose carrier plate TS1 through a mold, and the organic material is then cured by heat curing/light curing. Finally, the cured organic material is patterned to form the molding layer 400 including at least one through hole 410. The through hole 410 exposes the first adhering layer AD1 located therebelow.

In certain embodiments, the molding layer 400 includes a black resin or other light absorbing materials, and the material thereof includes, for example, an epoxy resin-based polymer material. The epoxy resin-based polymer material may be used as the Epoxy Molding Compound (EMC).

Figure 1E:
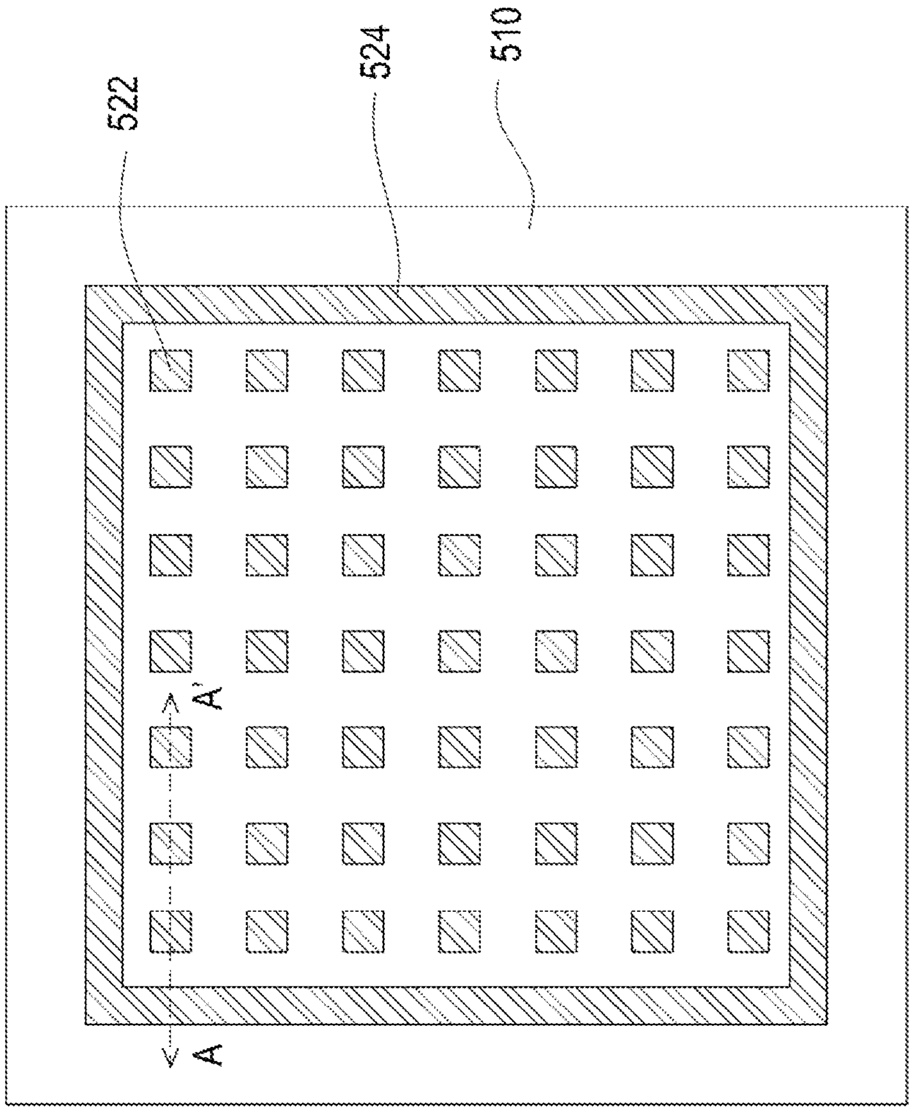
Figure 2E:
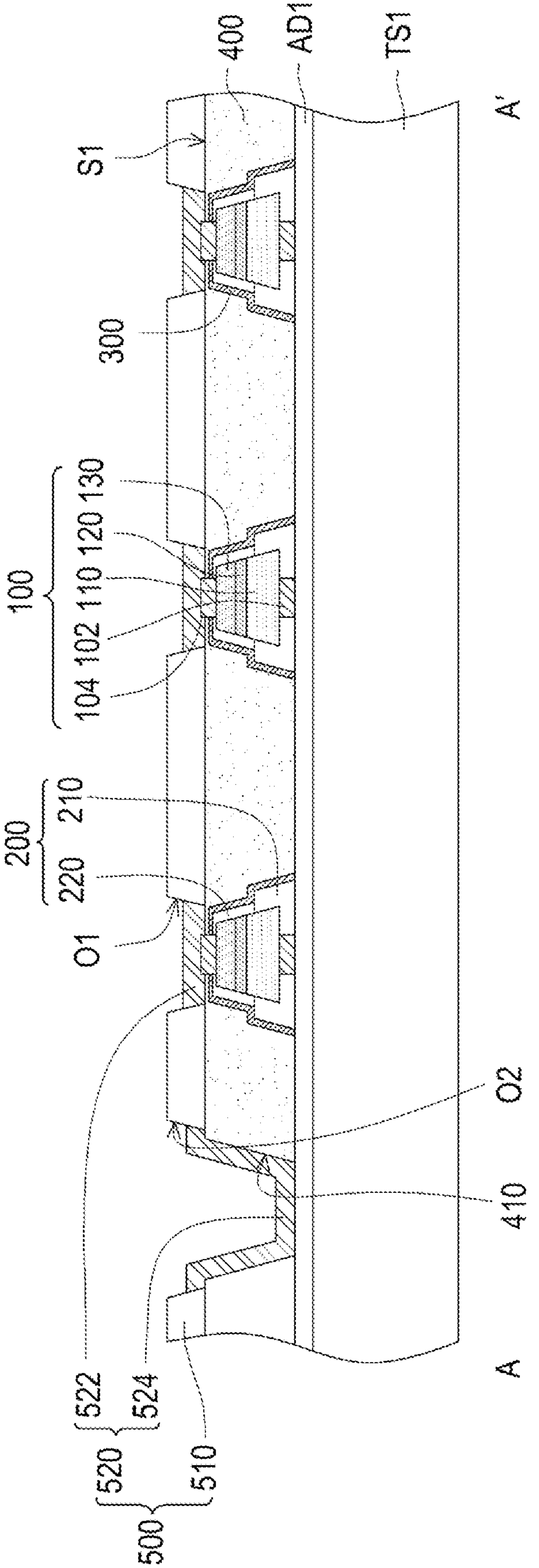

Referring to FIG. 1E and FIG. 2E, a redistribution structure 500 is formed at a first side S1 of the molding layer 400, and the redistribution structure 500 is electrically connected to the first electrodes 104 of the LEDs 100.

In the present embodiment, the redistribution structure 500 includes an insulating layer 510 and a conductive layer 520. The insulating layer 510 is formed on the first side S1 of the molding layer 400. The insulating layer 510 exposes bonding locations of the LED packaging structures. Specifically, the insulating layer 510 has a plurality of first openings O1 overlapping with the first electrodes 104 and at least one second opening O2 located at an outer side of the first openings O1. The through hole 410 of the molding layer 400 overlaps with the second opening O2.

In certain embodiments, the material of the insulating layer 510 includes silicon oxide, silicon nitride, silicon oxynitride, aluminum oxide, an organic insulating material or other suitable materials.

The conductive layer 520 is formed on the insulating layer 510, and the insulating layer 510 may be used to protect the conductive layer 520. The conductive layer 520 includes a plurality of first conductive structures 522 and at least one second conductive structure 524. The first conductive structures 522 are respectively filled in the first openings O1, and are electrically connected to the first electrodes 104 respectively. The second conductive structure 524 is filled in the second opening O2 and the through hole 410, and contacts the first adhering layer AD1. The second conductive structure 524 surrounds the LEDs 100. In the present embodiment, the second conductive structure 524 is located at an outer side of the LEDs 100, thus reducing the gaps between the LEDs 100, and enhancing the resolution of the display device.

The conductive layer 520 has a single-layered or multi-layered structure. In certain embodiments, the material of the conductive layer 520 includes indium, gold, nickel, copper, palladium, aluminum, titanium, an alloy thereof or a combination thereof.

Figure 1F:
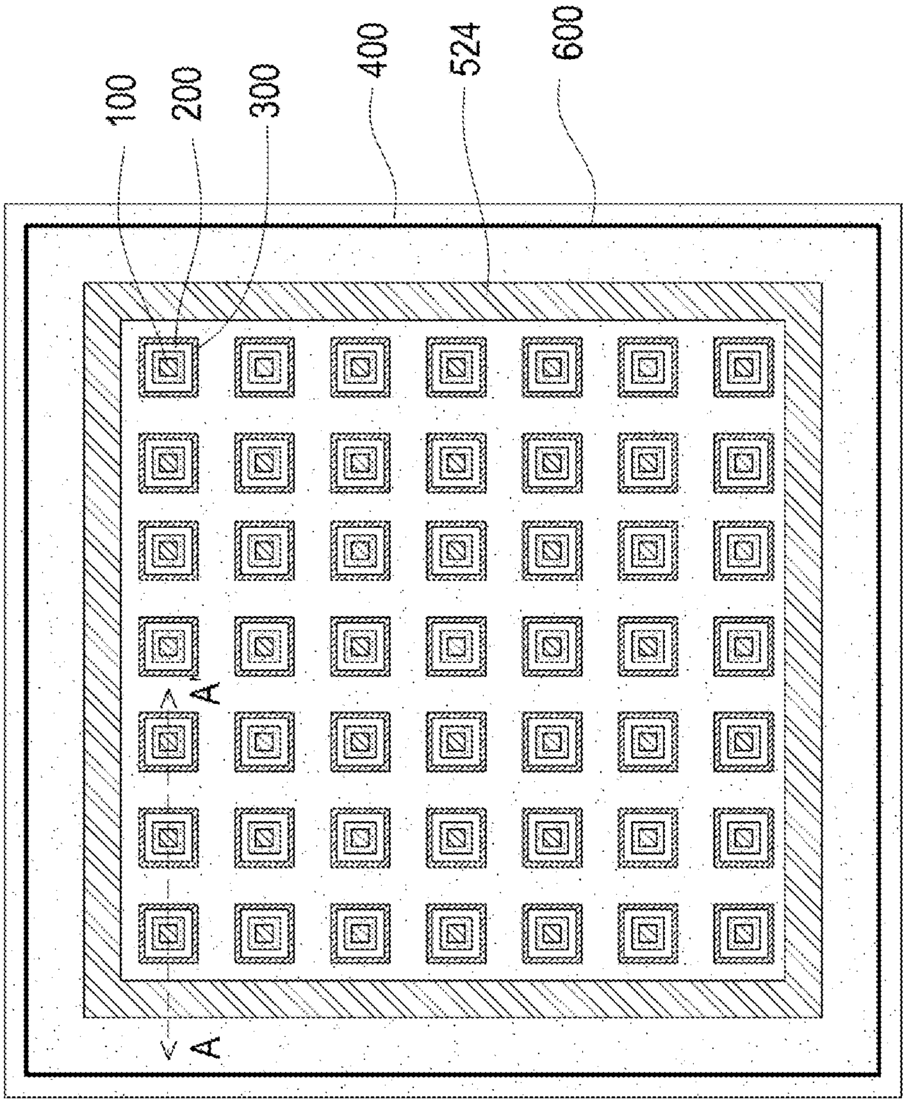
Figure 2F:
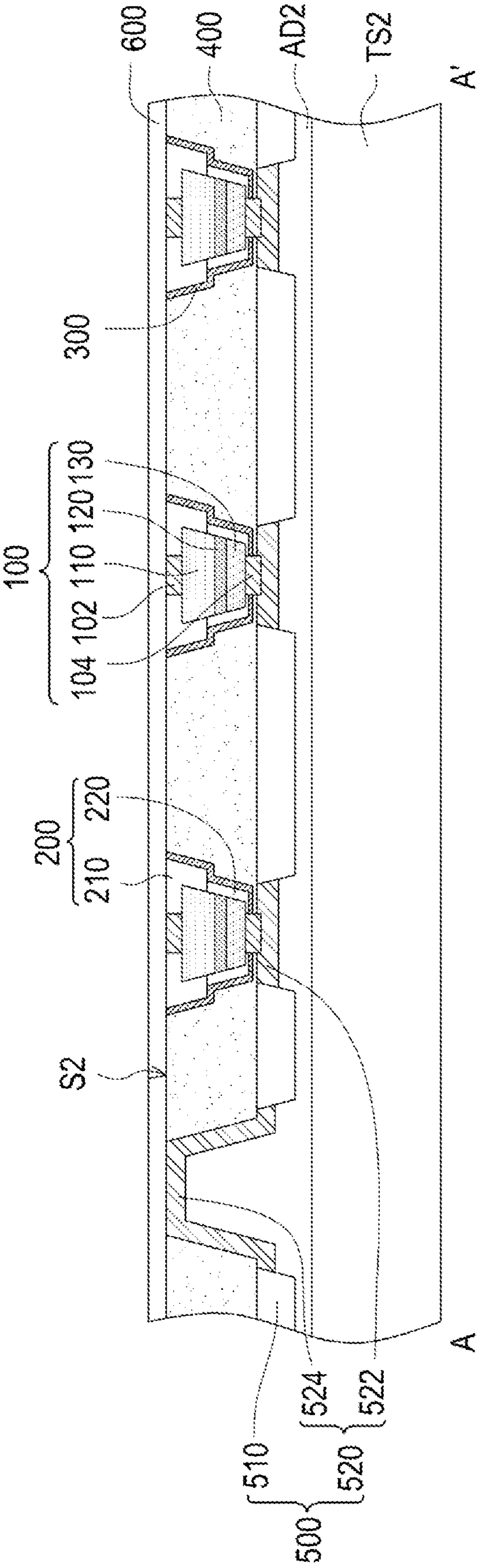

Referring to FIG. 1F and FIG. 2F, a second transpose carrier plate TS2 is connected to the redistribution structure 500, and the first transpose carrier plate TS1 is removed. In the present embodiment, a second adhering layer AD2 is formed on the second transpose carrier plate TS2, and the second transpose carrier plate TS2 adheres the redistribution structure 500 through the second adhering layer AD2. In certain embodiments, after adhering the second transpose carrier plate TS2 to the redistribution structure 500, the first adhering layer AD1 on the first transpose carrier plate TS1 is illuminated by a laser (referring to FIG. 2E), thus removing the first transpose carrier plate TS1.

The whole structure is flipped, such that a second side S2 of the molding layer 400 and the second electrodes 102 of the LEDs 100 face upward. A common electrode 600 is formed at the second side S2 of the molding layer 400, and the common electrode 600 is electrically connected to the second electrodes 102 of the LEDs 100 and the second conductive structure 524. In certain embodiments, the second side S2 of the molding layer 400, the second conductive structure 524 and the transparent packaging structures 200 are substantially coplanar. Thus, the common electrode 600 may be formed more smoothly over the entire surface. In certain embodiments, the common electrode 600 includes a transparent conductive material, such as indium tin oxide, indium zinc oxide, aluminum tin oxide, aluminum zinc oxide, indium gallium zinc oxide, or a stacked layer of at least two thereof.

Figure 1G:
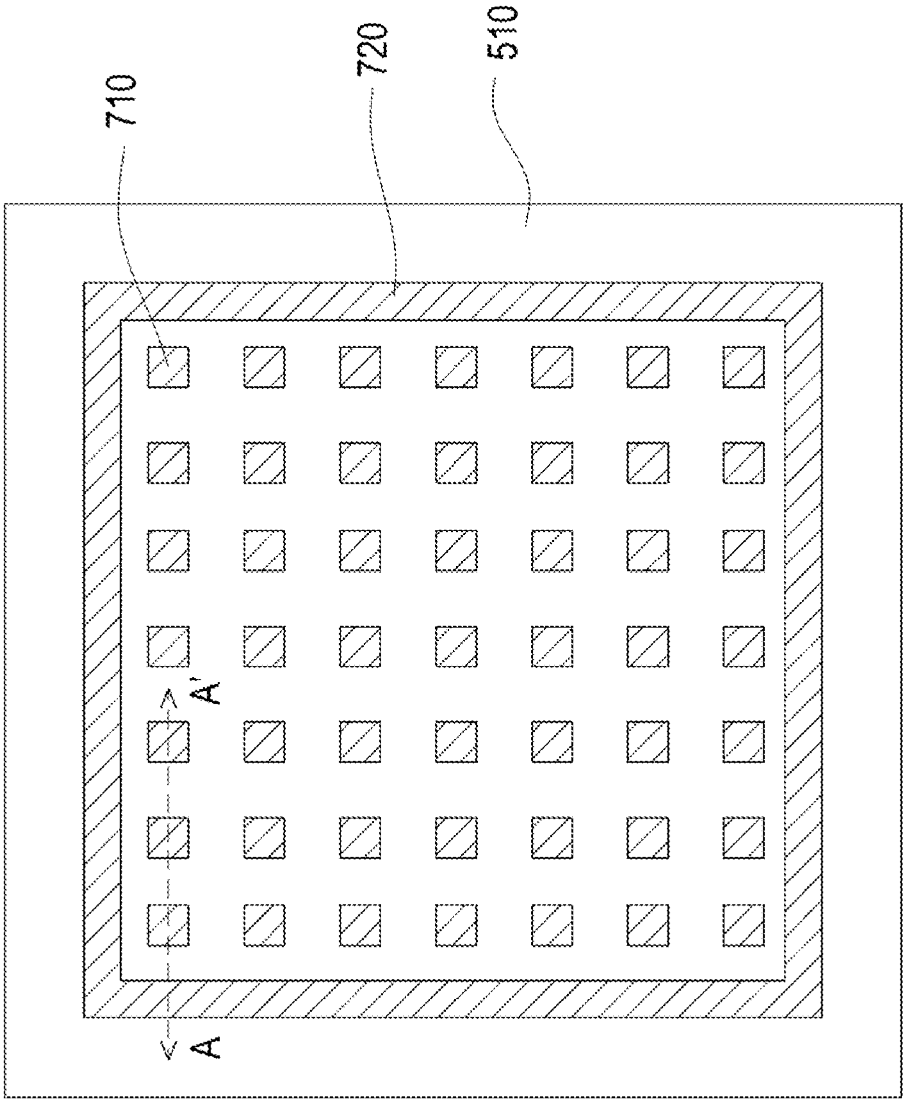
Figure 2G:
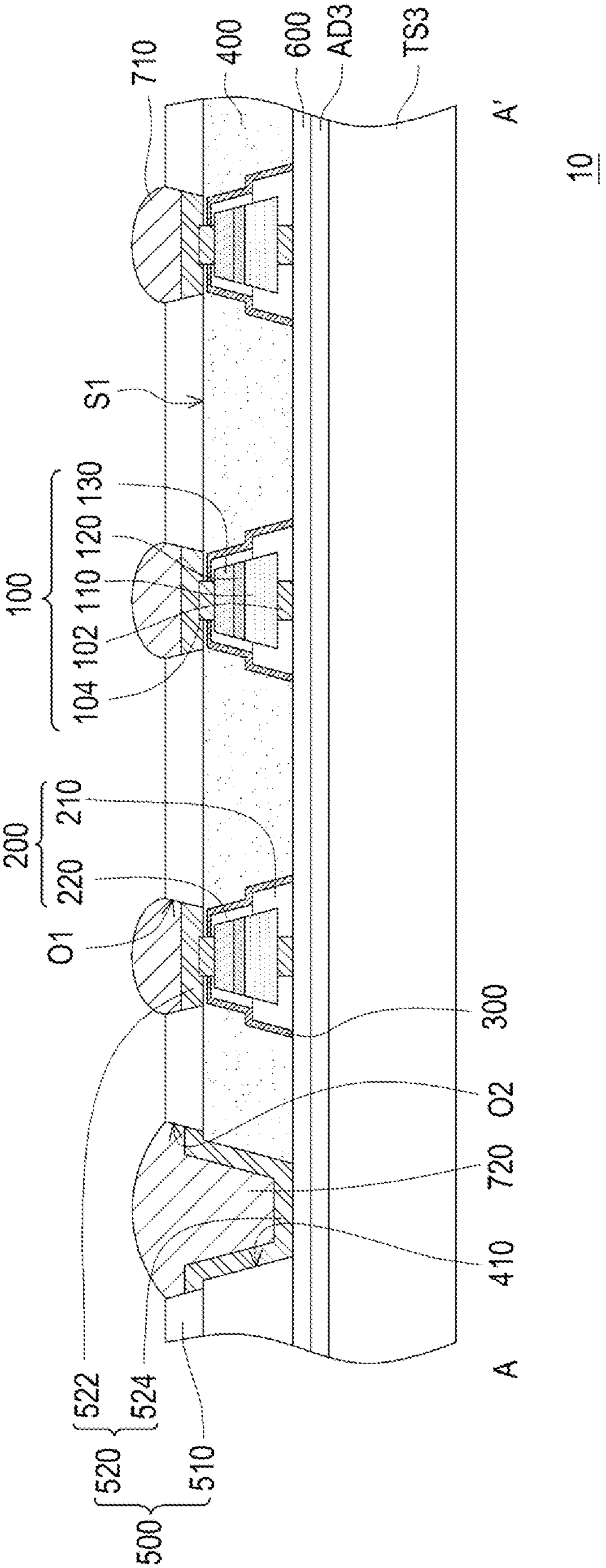

Referring to FIG. 1G and FIG. 2G, a third transpose carrier plate TS3 is connected to the common structure 600, and the second transpose carrier plate TS2 is removed. In the present embodiment, a third adhering layer AD3 is formed on the third transpose carrier plate TS3, and the third transpose carrier plate TS3 adheres the common electrode 600 through the third adhering layer AD3. In certain embodiments, after adhering the third transpose carrier plate TS3 to the common electrode 600, the second adhering layer AD2 on the second transpose carrier plate TS2 is illuminated by a laser (referring to FIG. 2F), thus removing the second transpose carrier plate TS2.

The whole structure is flipped, such that the first side S1 of the molding layer 400 and the redistribution structure 500 face upward. A plurality of first conductive terminals 710 and at least one second conductive terminal 720 are formed on the redistribution structure 500. The first conductive terminals 710 are electrically connected to the first electrodes 104 of the LEDs 100 respectively. In the present embodiment, the first conductive terminals 710 are electrically connected to the corresponding first electrodes 104 through the corresponding first conductive structures 522. The second conductive terminal 720 is electrically connected to the second conductive structure 524, the common electrode 600 and the second electrodes 102 of the LEDs 100.

In certain embodiments, the material of the first conductive terminals 710 and the second conductive terminal 720 includes solders, conductive adhesive or other suitable materials. In certain embodiments, the first conductive terminals 710 and the second conductive terminal 720 may be referred to as metal bumps. In certain embodiments, the first conductive terminals 710 are filled in the first openings O1 of the insulating layer 510, and the second conductive terminal 720 is filled in the second opening O2 of the insulating layer 510. The second conductive terminal 720 surrounds the first conductive terminals 710. Thus, a plurality of LED packaging structures 10 are formed on the third transpose carrier plate TS3.

In the present embodiment, each LED packaging structure 10 includes the LEDs 100, the transparent packaging structures 200, the reflective structures 300, the molding layer 400, the redistribution structure 500, the common electrode 600, the first conductive terminals 710 and the second conductive terminal 720. FIG. 1A to FIG. 1G and FIG. 2A to FIG. 2G shows the manufacturing method of a LED packaging structure 10. However, it is possible to simultaneously form a plurality of LED packaging structures 10, and separate the LED packaging structures 10 on the third transpose carrier plate TS3 by a laser. Specifically, in certain embodiments, the molding layers 400 of the LED packaging structures 10 on the third transpose carrier plate TS3 are connected together, and the molding layers 400 are cut by the laser to separate the LED packaging structures 10.

Further, the quantity of the LEDs 100 of each LED packaging structure 10 may be adjusted based on the needs. In certain embodiments, each LED packaging structure 10 includes one or more pixels, and each pixel includes LEDs 100 of different colors (such as a red LED, a green LED and a blue LED).

Figure 1H:
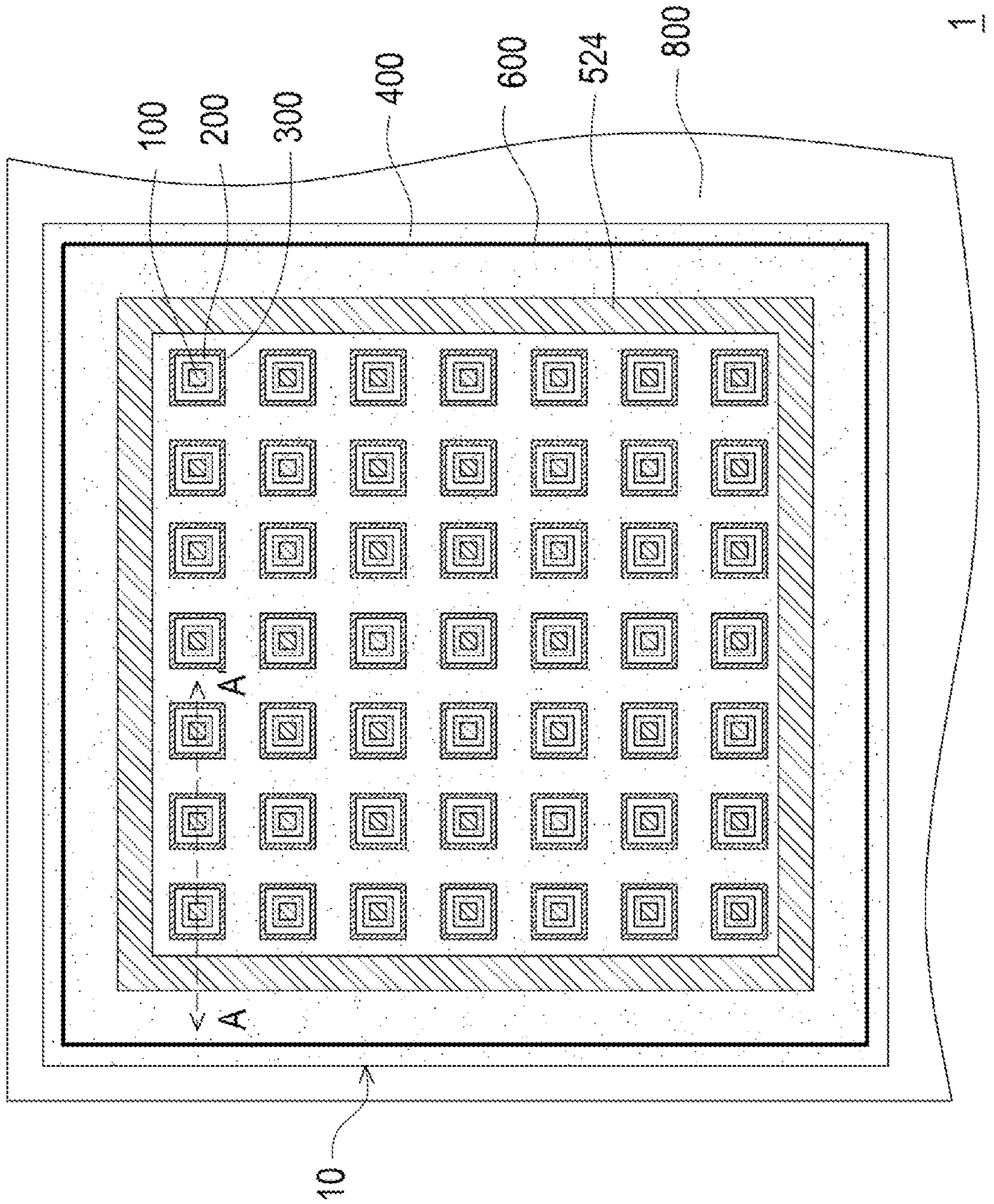
Figure 2H:
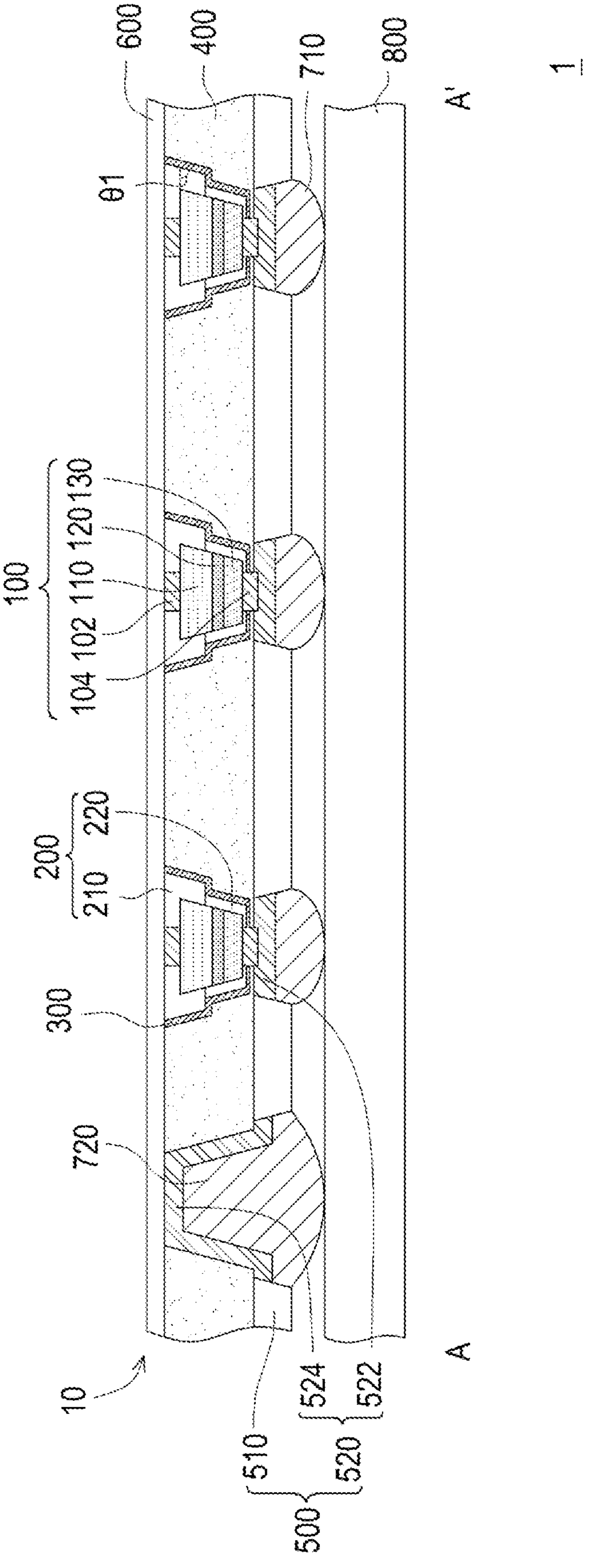

Referring to FIG. 1H and FIG. 2H, the redistribution structure 500 of one or more LED packaging structures 10 is electrically connected to a circuit substrate 800, thus forming the display device 1. In the present embodiment, the redistribution structure 500 is electrically connected to the circuit substrate 800 through the first conductive terminals 710 and the second conductive terminal 720. Then, the third transpose carrier plate TS3 is removed (referring to FIG. 2G). In certain embodiments, the third adhering layer AD3 on the third transpose carrier plate TS3 is illuminated by a laser, thus removing the third transpose carrier plate TS3. In certain embodiments, it is not required to provide other covering plates above the LED packaging structures 10, thus reducing the overall thickness of the display device.

In certain embodiments, prior to bonding the LED packaging structures 10 to the circuit substrate 800, a test may be performed to the LEDs 100 of the LED packaging structures 10. For example, the LEDs 100 are tested on the third transpose carrier plate TS3 (referring to FIG. 2G).

In certain embodiments, the method of electrically connecting the redistribution structure 500 of the LED packaging structures 10 to the circuit substrate 800 includes a soldering process (such as the surface mount technology (SMT), etc.) or other suitable processes. In the present embodiment, it is not required to perform a bonding process (such as soldering) between the LED packaging structures 10 and the circuit substrate 800 at the light emitting side of each LED packaging structure 10 (a side of the common electrode 600), thus enhancing the luminous efficiency of the display device. Further, in the present embodiment, the LEDs 100 are electrically connected to the circuit structure in a single step using the LED packaging structure 10 as a unit, thus addressing the splashing issue of the LEDs 100 that may occur during the mass transfer process.

In certain embodiments, the circuit substrate 800 is a flexible substrate or a rigid substrate, and includes a printed circuit board, a silicon-based backplane including circuit structures, a glass substrate including circuit structures, or any other suitable substrates. In certain embodiments, the circuit substrate 800 includes circuits and active components (not illustrated). In certain embodiments, in each LED packaging structure 10, the first electrode 104 of each LED 100 is electrically connected to a corresponding active component (such as a thin-film transistor) in the circuit substrate 800 through a corresponding first conductive structure 522 and a corresponding first conductive terminal 710, and the second electrode 102 of each LED 100 is electrically connected to a common signal line (not illustrated) in the circuit substrate 800 through the common electrode 600, the second conductive structure 524 and the second conductive terminal 720.

In certain embodiments, an included angle θ1 between the light emitting surface of each LED 100 (the surface of the LED 100 facing the common electrode 600) and the side wall of each transparent packaging structure 200 is 30 degrees to 60 degrees, and is preferably 30 degrees to 55 degrees. Table 1 shows the difference between the luminous efficiency of the LEDs of the display devices in the comparative embodiment and the embodiment 1 to embodiment 3, in which the luminous efficiency of the LEDs of the comparative embodiment is 100%. In Table 1, the display device of the comparative embodiment does not have the transparent packaging structures 200, the reflective structures 300 and the molding layer 400. The display devices of the embodiment 1 to embodiment 3 have the structure as shown in FIG. 2H, and the difference therebetween exists in that the embodiment 1 to embodiment 3 have different included angles θ1.

TABLE 1

| | Included angle θ1 | Luminous efficiency |
|---|---|---|
| Comparative Embodiment 1 | | 100% |
| Embodiment 1 | 30 degree | 133% |
| Embodiment 2 | 45 degree | 129% |
| Embodiment 3 | 60 degree | 122% |

It is understood from Table 1 that, by providing the transparent packaging structures 200 and the reflective structures 300, the luminous efficiency of the display device may be effectively enhanced.

Figure 3A:
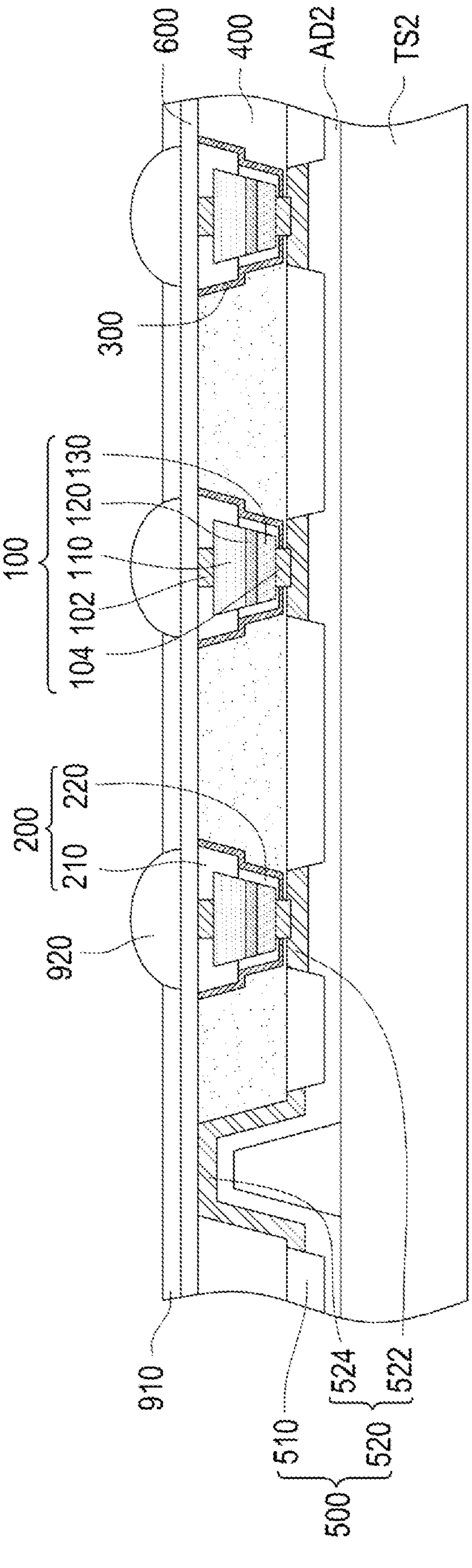
FIG. 3A to FIG. 3C are sectional schematic views of a manufacturing method of a display device according to certain embodiments of the present disclosure.
Figure 3B:
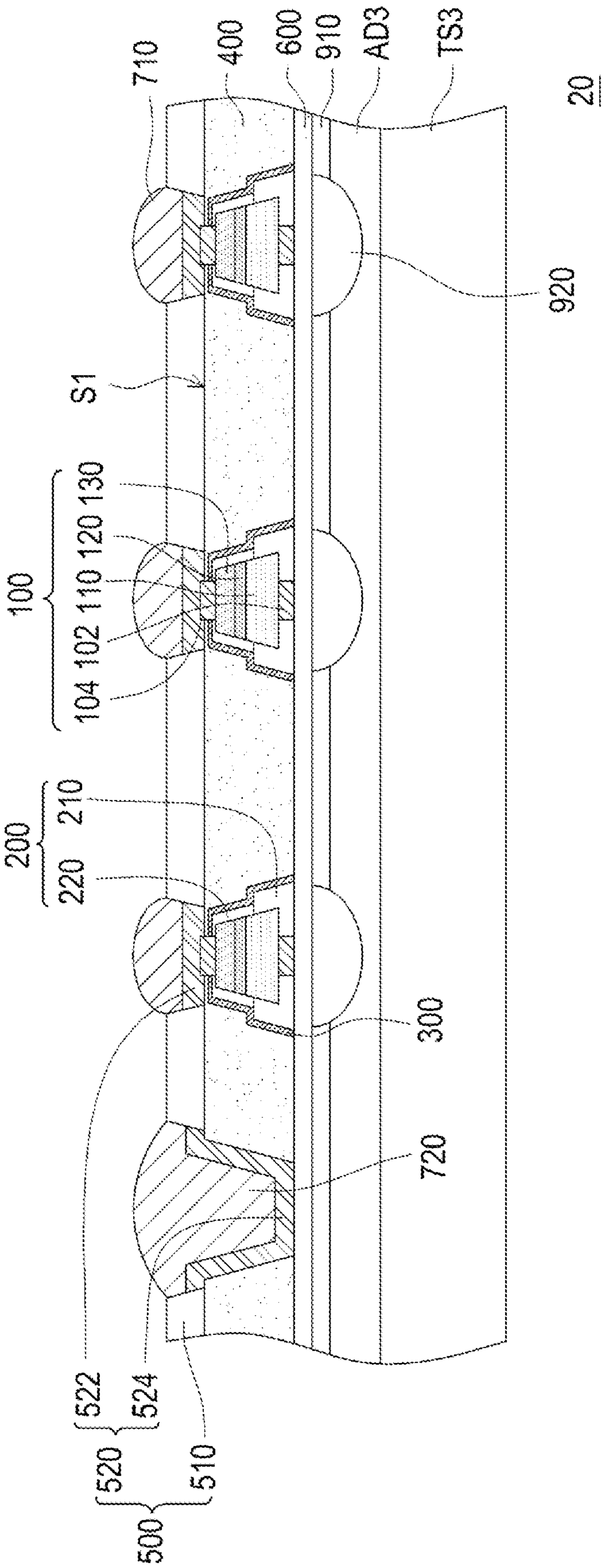
Figure 3C:
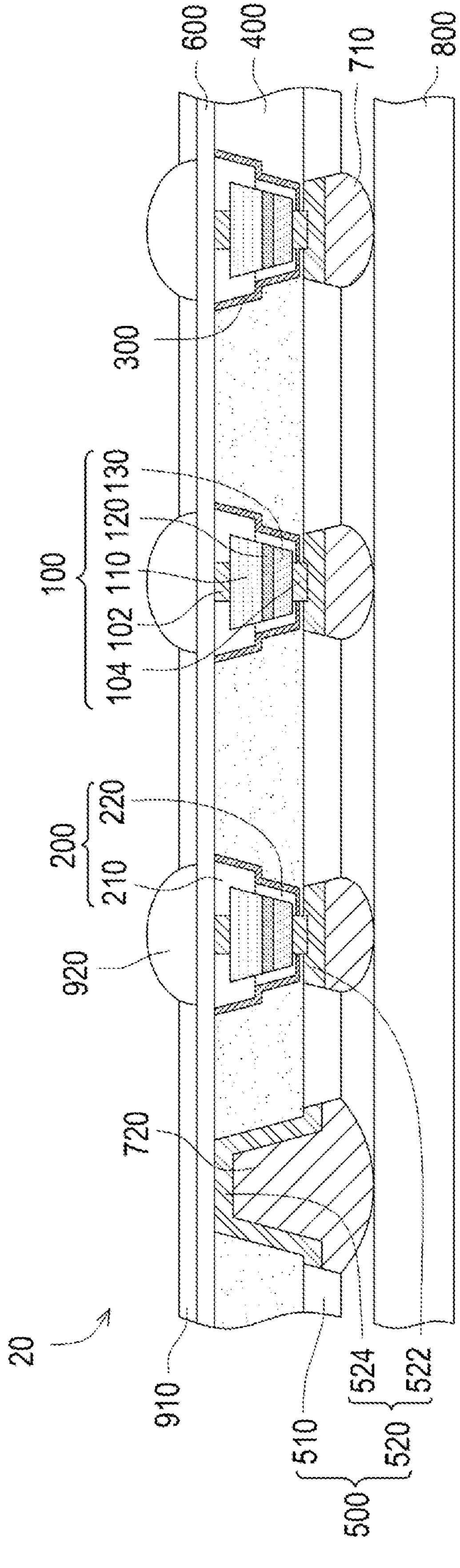

FIG. 3A to FIG. 3C are sectional schematic views of a manufacturing method of a display device according to certain embodiments of the present disclosure. It should be noted that the embodiment of FIG. 3A to FIG. 3C uses the reference numerals and certain contents of the embodiment of FIG. 1A to FIG. 2H, in which identical or similar components are identified by identical reference numerals, and descriptions of the identical technical contents will be omitted. The omitted descriptions may be referenced to in the aforementioned embodiment, and are not hereinafter reiterated.

Referring to FIG. 3A, subsequent to the manufacturing process of FIG. 1F and FIG. 1F, a plurality of lens structures 920 are formed above the common electrode 600, and the lens structures 920 respectively overlap with the LEDs 100. In the present embodiment, a protection layer 910 having a plurality of openings is firstly formed on the common electrode 600, and then the lens structures 920 are formed in the openings of the protection layer 910.

Referring to FIG. 3B, the third transpose carrier plate TS3 is connected to the common electrode 600, and the second transpose carrier plate TS2 is removed. In the present embodiment, a third adhering layer AD3 is formed on the third transpose carrier plate TS3, and the third transpose carrier plate TS3 adheres the common electrode 600 through the third adhering layer AD3. In the present embodiment, the third adhering layer AD3 covers the lens structures 920.

The whole structure is flipped, such that the first side S1 of the molding layer 400 and the redistribution structure 500 face upward. A plurality of first conductive terminals 710 and at least one second conductive terminal 720 are formed on the redistribution structure 500. Thus, the LED packaging structures 20 are formed to be located on the third transpose carrier plate TS3.

In the present embodiment, each LED packaging structure 20 includes the LEDs 100, the transparent packaging structures 200, the reflective structures 300, the molding layer 400, the redistribution structure 500, the common electrode 600, the first conductive terminals 710, the second conductive terminal 720, the protection layer 910 and the lens structure 920.

Referring to FIG. 3C, the redistribution structure 500 of one or more LED packaging structures 20 is electrically connected to the circuit substrate 800 to form the display device 2.

In addition, in the present embodiment, prior to connecting the third transpose carrier plate TS3 to the common electrode 600, the protection layer 910 and the lens structures 920 are formed above the common electrode 600, but the present disclosure is not limited thereto. In other embodiments, after the redistribution structure 500 is electrically connected to the circuit substrate 800, the protection layer 910 and the lens structures 920 are formed above the common electrode 600.

Figure 4:
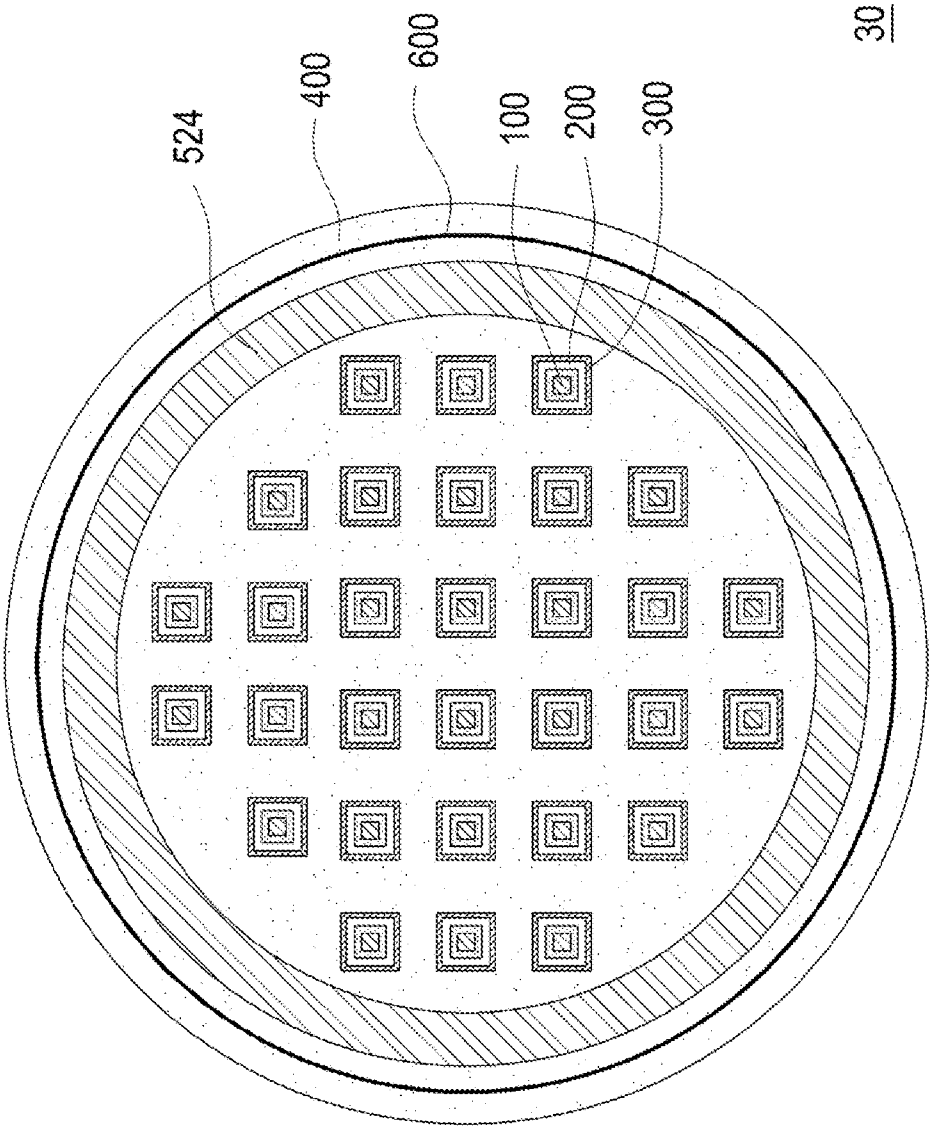
FIG. 4 is a top schematic view of a LED packaging structure according to certain embodiments of the present disclosure.

FIG. 4 is a top schematic view of a LED packaging structure 30 according to certain embodiments of the present disclosure. It should be noted that the embodiment of FIG. 4 uses the reference numerals and certain contents of the embodiment of FIG. 1A to FIG. 2H, in which identical or similar components are identified by identical reference numerals, and descriptions of the identical technical contents will be omitted. The omitted descriptions may be referenced to in the aforementioned embodiment, and are not hereinafter reiterated.

The main difference between the LED packaging structure 30 of FIG. 4 and the LED packaging structure 10 of FIG. 1H exists in that: the LED packaging structure 10 of FIG. 1H has a rectangular projection shape, and the LED packaging structure 30 of FIG. 4 has a circular projection shape. It should be noted that the shape of the LED packaging structure may be adjusted based on actual needs.

Figure 5:
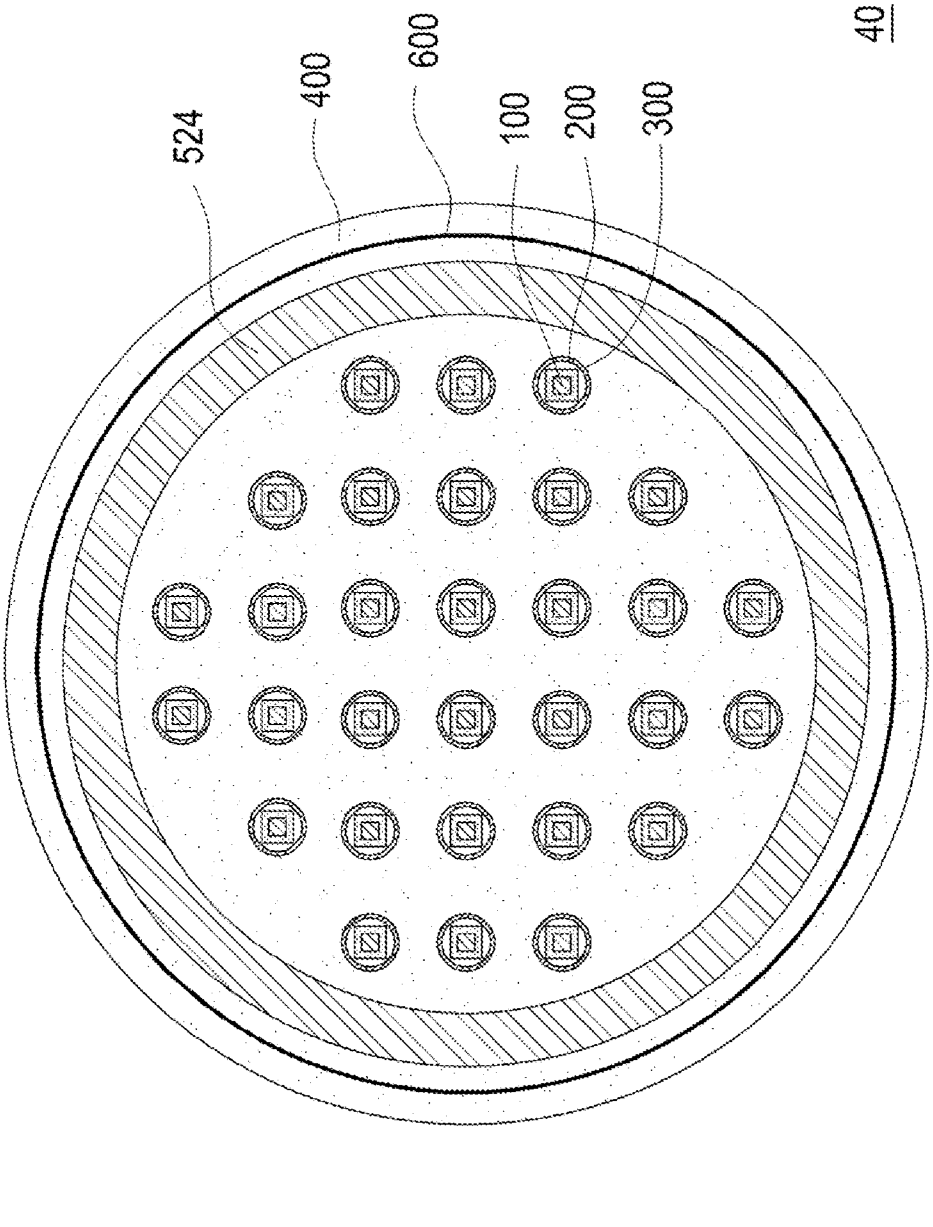
FIG. 5 is a top schematic view of a LED packaging structure according to certain embodiments of the present disclosure.

FIG. 5 is a top schematic view of a LED packaging structure 40 according to certain embodiments of the present disclosure. It should be noted that the embodiment of FIG. 5 uses the reference numerals and certain contents of the embodiment of FIG. 4, in which identical or similar components are identified by identical reference numerals, and descriptions of the identical technical contents will be omitted. The omitted descriptions may be referenced to in the aforementioned embodiment, and are not hereinafter reiterated.

The main difference between the LED packaging structure 40 of FIG. 5 and the LED packaging structure 30 of FIG. 4 exists in that: each transparent packaging structure 200 of the LED packaging structure 30 of FIG. 4 has a rectangular projection shape, and each transparent packaging structure 200 of the LED packaging structure 40 of FIG. 5 has a circular projection shape. It should be noted that the shape of the transparent packaging structure 200 may be adjusted based on actual needs.

Figure 6:
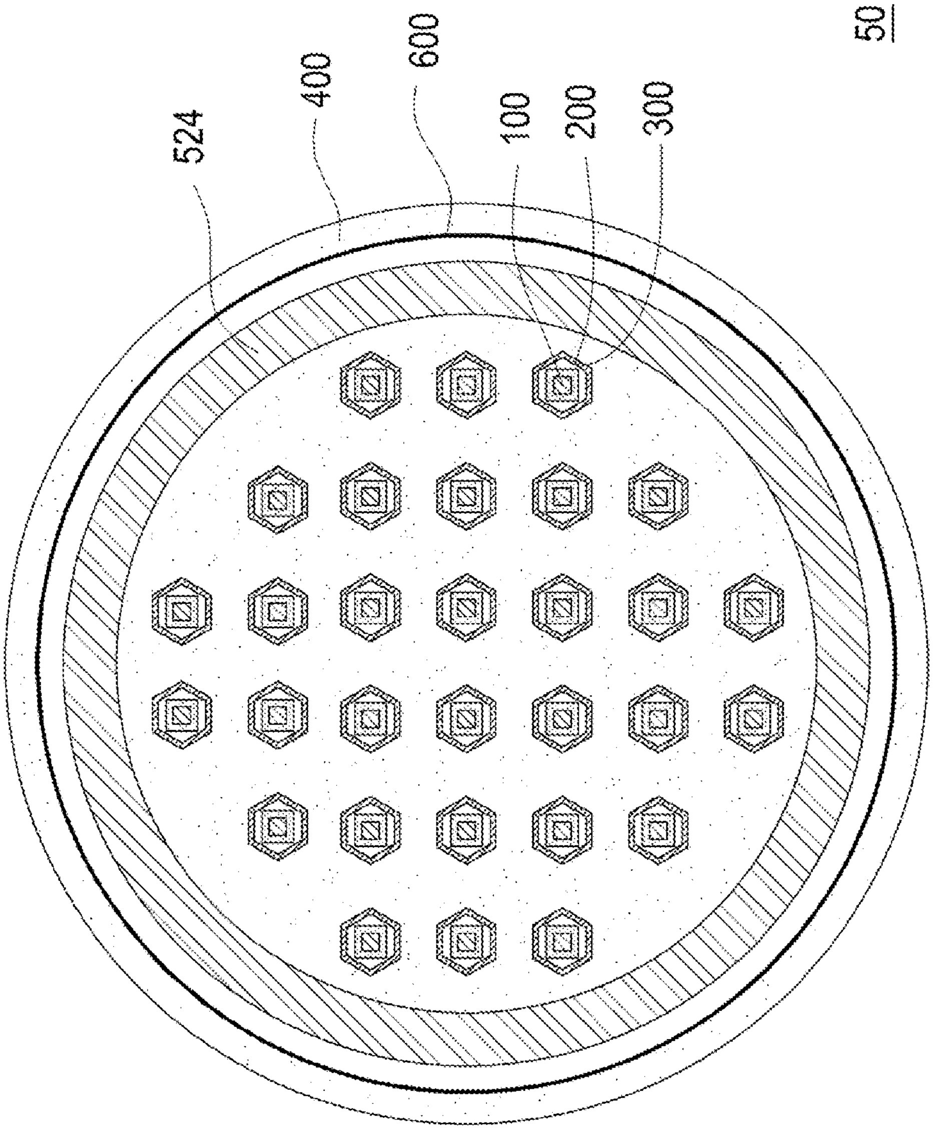
FIG. 6 is a top schematic view of a LED packaging structure according to certain embodiments of the present disclosure.

FIG. 6 is a top schematic view of a LED packaging structure 50 according to certain embodiments of the present disclosure. It should be noted that the embodiment of FIG. 6 uses the reference numerals and certain contents of the embodiment of FIG. 4, in which identical or similar components are identified by identical reference numerals, and descriptions of the identical technical contents will be omitted. The omitted descriptions may be referenced to in the aforementioned embodiment, and are not hereinafter reiterated.

The main difference between the LED packaging structure 50 of FIG. 6 and the LED packaging structure 30 of FIG. 4 exists in that: each transparent packaging structure 200 of the LED packaging structure 30 of FIG. 4 has a rectangular projection shape, and each transparent packaging structure 200 of the LED packaging structure 50 of FIG. 6 has a hexagonal projection shape. It should be noted that the shape of the transparent packaging structure 200 may be adjusted based on actual needs.

Figure 7:
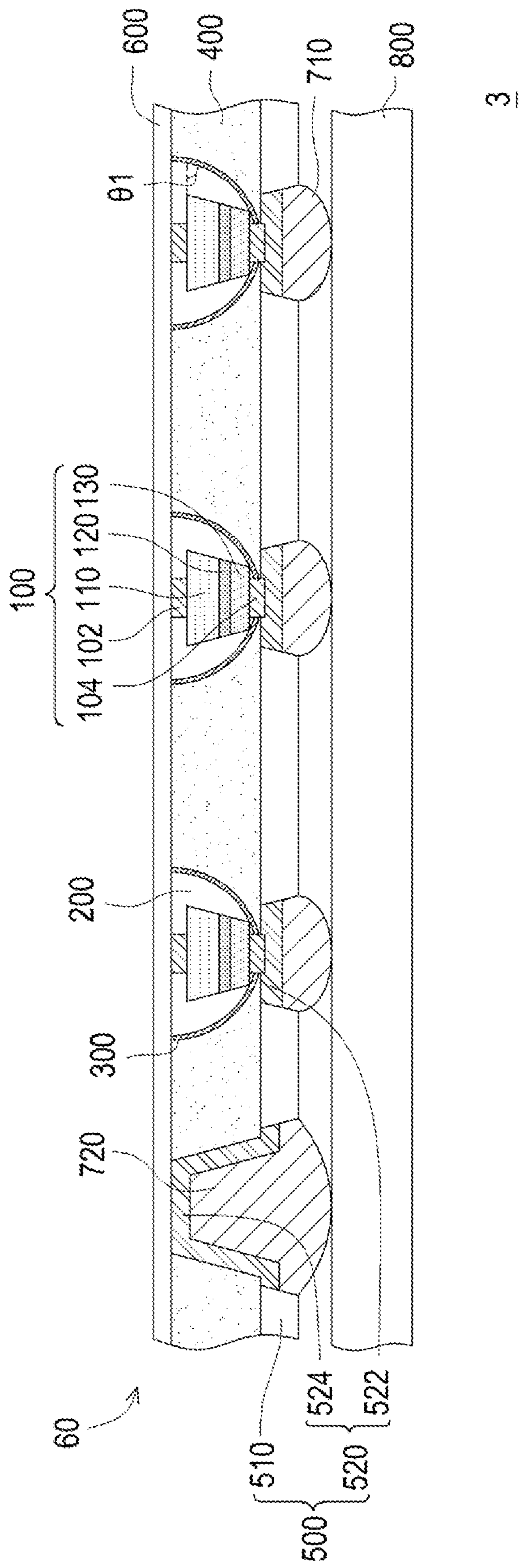
FIG. 7 is a sectional schematic view of a display device according to certain embodiments of the present disclosure.

FIG. 7 is a sectional schematic view of a display device 3 according to certain embodiments of the present disclosure. It should be noted that the embodiment of FIG. 7 uses the reference numerals and certain contents of the embodiment of FIG. 2H, in which identical or similar components are identified by identical reference numerals, and descriptions of the identical technical contents will be omitted. The omitted descriptions may be referenced to in the aforementioned embodiment, and are not hereinafter reiterated.

The main difference between the display device 3 of FIG. 7 and the display device 1 of FIG. 2H exists in that: each transparent packaging structure 200 of the LED packaging structure 10 of the display device 1 of FIG. 2H has a ladder-shaped side wall, and each transparent packaging structure 200 of the LED packaging structure 60 of the display device 3 of FIG. 7 has a curve-shaped side wall. In certain embodiments, an included angle $\theta 1$ between the light emitting surface of each LED 100 (the surface of the LED 100 facing the common electrode 600) and the side wall of each transparent packaging structure 200 is 30 degrees to 60 degrees, and is preferably 30 degrees to 55 degrees.

In sum, a single LED packaging structure includes a plurality of LEDs. Thus, by transferring one LED packaging structure to the circuit substrate, the LEDs are simultaneously transferred to the circuit substrate, thus reducing the difficulty of the transfer process.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A manufacturing method of a display device, comprising:

transferring a plurality of light emitting diodes from a growth substrate to a first transpose carrier plate to adhere the light emitting diodes on the first transpose carrier plate through a first adhering layer, wherein each of the light emitting diodes comprises a first electrode, a semiconductor stack structure and a second electrode stacked with each other, and wherein the second electrode is located between the first adhering layer and the first electrode;

forming a plurality of transparent packaging structures respectively on the light emitting diodes, wherein the transparent packaging structures contact the first adhering layer;

forming a molding layer on the first transpose carrier plate, wherein the molding layer is located between adjacent ones of the transparent packaging structures to contact the first adhering layer, and wherein the molding layer exposes the first electrodes of the light emitting diodes;

forming a redistribution structure at a first side of the molding layer, wherein the redistribution structure comprises a conductive layer and an insulating layer, wherein the conductive layer comprises a plurality of first conductive structures respectively filled in a plurality of first openings of the insulating layer, and wherein the first conductive structures are electrically connected to the first electrodes of the light emitting diodes respectively;

connecting a second transpose carrier plate to the conductive layer and the insulating layer of the redistribution structure through a second adhering layer, and removing the first transpose carrier plate;

forming a common electrode at a second side of the molding layer, wherein the common electrode is electrically connected to the second electrodes of the light emitting diodes; and electrically connecting the conductive layer of the redistribution structure to a circuit substrate.

2. The manufacturing method of the display device according to claim 1, further comprising:

prior to forming the molding layer on the first transpose carrier plate, forming a plurality of reflective structures respectively on the transparent packaging structures.

3. The manufacturing method of the display device according to claim 1, further comprising:

forming a plurality of lens structures above the common electrode, wherein the lens structures respectively overlap with the light emitting diodes.

4. The manufacturing method of the display device according to claim 1, further comprising:

after forming the common electrode at the second side of the molding layer, connecting a third transpose carrier plate to the common electrode through a third adhering layer, and removing the second transpose carrier plate;

forming a plurality of first conductive terminals and at least one second conductive terminal on the redistribution structure, wherein the first conductive terminals are electrically connected to the first electrodes respectively, and the at least one second conductive terminal is electrically connected to the common electrode; and electrically connecting the redistribution structure to the circuit substrate by the first conductive terminals and the at least one second conductive terminal.

5. The manufacturing method of the display device according to claim 1, wherein a method of forming the transparent packaging structures respectively on the light emitting diodes comprises:

forming a plurality of first covering layers on the first transpose carrier plate, wherein the first covering layers respectively surround the light emitting diodes; and forming a plurality of second covering layers respectively on the first covering layers, wherein each of the transparent packaging structures comprises a corresponding one of the first covering layers and a corresponding one of the second covering layers.

* * * * *